(12) United States Patent
Stillman

(10) Patent No.: US 7,145,354 B2
(45) Date of Patent: Dec. 5, 2006

(54) RESILIENT PROBES FOR ELECTRICAL TESTING

(75) Inventor: Daniel J. Stillman, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/116,684

(22) Filed: Apr. 27, 2005

(65) Prior Publication Data

US 2006/0214675 A1    Sep. 28, 2006

Related U.S. Application Data

(60) Provisional application No. 60/665,676, filed on Mar. 28, 2005.

(51) Int. Cl.
G01R 31/02 (2006.01)
(52) U.S. Cl. .................................... 324/754
(58) Field of Classification Search ............... 324/754, 324/755, 765, 761–762, 158.1; 439/169, 439/219, 482
See application file for complete search history.

(56) References Cited

U.S. PATENT DOCUMENTS

| | | | | |
|---|---|---|---|---|
| 5,940,278 | A  * | 8/1999 | Schumacher | ................. 361/769 |
| 6,204,681 | B1 * | 3/2001 | Nagatsuka et al. | .......... 324/761 |
| 6,215,321 | B1 * | 4/2001 | Nakata | ....................... 324/754 |
| 6,820,794 | B1 * | 11/2004 | Olsen | .......................... 228/103 |

OTHER PUBLICATIONS

Reynaldo M. Rincon, et al. "Multiple-Chip Probe and Universal Tester Contact Assemblage" U.S. Appl. No. 09/915,919, filed Jul. 26, 2001.

* cited by examiner

*Primary Examiner*—Jermele Hollington
*Assistant Examiner*—Tung X. Nguyen
(74) *Attorney, Agent, or Firm*—Yingsheng Tung; Wade James Brady, III; Frederick J. Telecky, Jr.

(57) ABSTRACT

An apparatus for electrical testing having probes (201) constructed of metal elements (201a) of about equal size bonded together in substantially linear sequence. Further an insulating holder (202) having first and second surfaces and a plurality of metal-filled vias (210) traversing the holder from the first to the second surface; the vias form contact pads on the first and second surfaces. The contact pads (210a) of the first holder surface have a probe attached so that the probe is positioned about normal to the surface. A sheet (203) of resilient insulating material, which has first and second surfaces and a thickness traversed by a plurality of conducting traces (220), has its first sheet surface attached to the second holder surface so that at least one of the traces contacts one of the contact pads, respectively, to provide an electrical path to the second sheet surface. A printed circuit board, suitable for insertion into an electrical test apparatus, is attached to the second sheet surface so that a continuous electrical path is established from the apparatus to each of the probes.

19 Claims, 3 Drawing Sheets

RESILIENT PROBES FOR ELECTRICAL TESTING

This application claims priority under 35 USC § 119 (e)(1) of provisional application Ser. No. 60/665,676 filed Mar. 28, 2005.

FIELD OF THE INVENTION

The present invention is related in general to the field of semiconductor devices and testing and more specifically to the structure of a test head and the corresponding testing method, which provide testing of devices and is particularly suitable for fine pitch or even irregular distribution of signal and power pads.

DESCRIPTION OF THE RELATED ART

Semiconductor devices and especially integrated circuits are subjected twice to significant testing. The final test is a functional a.c. test to check the performance of the fully assembled and encapsulated device before its delivery to the customer. Among the parameters tested are speed, propagation delay, and signal rise and fall. The final test needs to ascertain that the device meets the customer's specification and is, consequently, often coupled with an accelerated life test to prove the device's reliability under severe, but well defined environmental conditions.

Before the assembly and encapsulation steps, the semiconductor chips, still in wafer form, are subjected to a d.c. parametric test, which principally measures leakage currents and compares input and output voltages. While these tests do not require special precautions for cooling the devices, since they are not operated "at speed", they do require electrical contacts to the input/output terminals of the devices. The electrical contacts have to be established reliably and should be non-permanent, low-resistance, and non-rectifying. It is common practice, to use metallic probes as the means to establish the necessary electrical contact.

The input/output terminals of electrical devices are often referred to as bond pads, since they serve, in the assembly process step, as contact areas for attaching the wire bonds for the connection to leadframes or substrates. The most common metal used for the bond pads is aluminum, which forms, due its exposure to ambient conditions, a thin, continuous, but self-limiting layer of aluminum oxide. The metallic probes have to be able to penetrate the oxide layer in order to reach the underlying pure metal for reliable electrical test measurements.

In present technology, the act of penetrating through the metal oxide and performing the electrical testing is performed by a plurality of needles, preferably made of tungsten. These needles are formed as long cantilevers, substantially in horizontal layout, which are finally bent into a more vertical portion ending in a finely sharpened tip. The back end of the needles, opposite to the sharpened tip, is attached to a probe card, and the tips are carefully aligned to the location of the bond pads-to-be-tested. Since there are commonly several hundred of these needles per probe card, and the needle pitch at the tips is of the order of 40 to 70 μm, the assembly of the probe cards is exceedingly tedious. The assembly has to be executed manually due to the variability of the bond pad locations from device type to device type. Consequently, probe cards are very expensive, and their handling is very sensitive.

It is well known in the semiconductor industry, how frustrating it is when one or more needle is misshaped or does no longer operate reliably. Given the large number of needles, their dense packing, and their mechanical sensitivity, malfunctioning is unfortunately experienced frequently after only several hundred touch-downs so that expensive probe cards need to be replaced.

SUMMARY OF THE INVENTION

Applicant recognizes a need for a low-cost, mechanically robust, and operationally reliable structure of probe cards for electrical testing. It is further a technical advantage when the methodology provides custom-designs of the probe cards, especially when they should be operated for test pads laid out in x- and y-directions. The concept should also be flexible enough to be applied to different semiconductor product families and compatible with the industry trend towards devices with reflow bumps (solder balls) rather than wire bonds. The new probe card structure should not only meet high reliability and low maintenance, but should also achieve improvements towards the goals of enhanced fabrication yields and device testing time reduction.

One embodiment of the invention is an apparatus for electrical testing. The apparatus has probes constructed of metal elements of about equal size bonded together in substantially linear sequence. Further it has an insulating holder having first and second surfaces and a plurality of metal-filled vias traversing the holder from the first to the second surface; the vias form contact pads on the first and second surfaces. The contact pads of the first holder surface have a probe attached so that the probe is positioned about normal to the surface. A sheet of resilient insulating material, which has first and second surfaces and a thickness traversed by a plurality of conducting traces, has its first sheet surface attached to the second holder surface so that at least one of the traces contacts one of the contact pads, respectively, to provide an electrical path to the second sheet surface. A printed circuit board, suitable for insertion into an electrical test apparatus, is attached to the second sheet surface so that a continuous electrical path is established from the apparatus to each of the probes.

The metal elements, which form each probe, are preferably created as free air balls in the wire bonding technique; 2 to 6 elements are placed on top of each other to create the probe; the metal should be non-oxidizing and contains preferably gold. The tips of the probes may be coplanar or they may be out of coplanarity, depending on the contour of the chip design; preferably, the probe tips are pointed, for example by a coining technique.

The probes can be placed on customized locations of the holder, with the preferred pitch center-to-center between about 40 and 80 μm, even smaller when desired. The probes can utilize the complete x-y plane.

Examples for the resilient insulating material are z-axis conducting elastic polymers, including epoxies and polyimides, and a plurality of elastic springs, for instance micropogo-springs embedded in an insulator. The thickness of the resilient material is selected so that it provides a predetermined amount of elastic compression and expansion. In the case of aluminum as bond pad metallization, an elastic compression and expansion of at least 10 μm is preferred in order to break reliably through the aluminum oxide.

Another embodiment of the invention is an electrically tested semiconductor device, which has a plurality of test members such as test pads covered with metal or a solder ball. First, an apparatus is provided including a plurality of probes and a sheet of resilient material as described above. Next, the apparatus is aligned with the semiconductor device so that the probes are aligned with the test members, respectively. The probes are then brought into contact with the test members so that the sheet of resilient material is compressed and the probes break through any metal oxide layer on the test member; the electrical testing can get started.

Embodiments of the present invention are related to multiprobe testing of semiconductor wafers of devices based on silicon, silicon germanium, gallium arsenide, and any other semiconductor compound used for device production. It is a technical advantage that the test pads of these devices may have any distribution and do not have to be arrayed along the chip periphery or in any other particular order. The invention lends itself to probe cards for devices with a non-coplanar surface, since the invention allows the probes to be manufactured at variable lengths.

It is another technical advantage of the invention that the test card manufacture is inexpensive compared to cards made by the conventional technology; it uses automated processes such as ball formation in wire bonders, and automated assembly. Another technical advantage of the invention is the fact that the testing procedure leaves only minimal marks in the metallization of the test pads, which greatly simplifies subsequent processing steps of the semiconductor devices.

The technical advantages represented by certain embodiments of the invention will become apparent from the following description of the preferred embodiments of the invention, when considered in conjunction with the accompanying drawings and the novel features set forth in the appended claims.

DETAILED DESCRIPTION OF THE PREFERRED EMBODIMENTS

Figure 1:
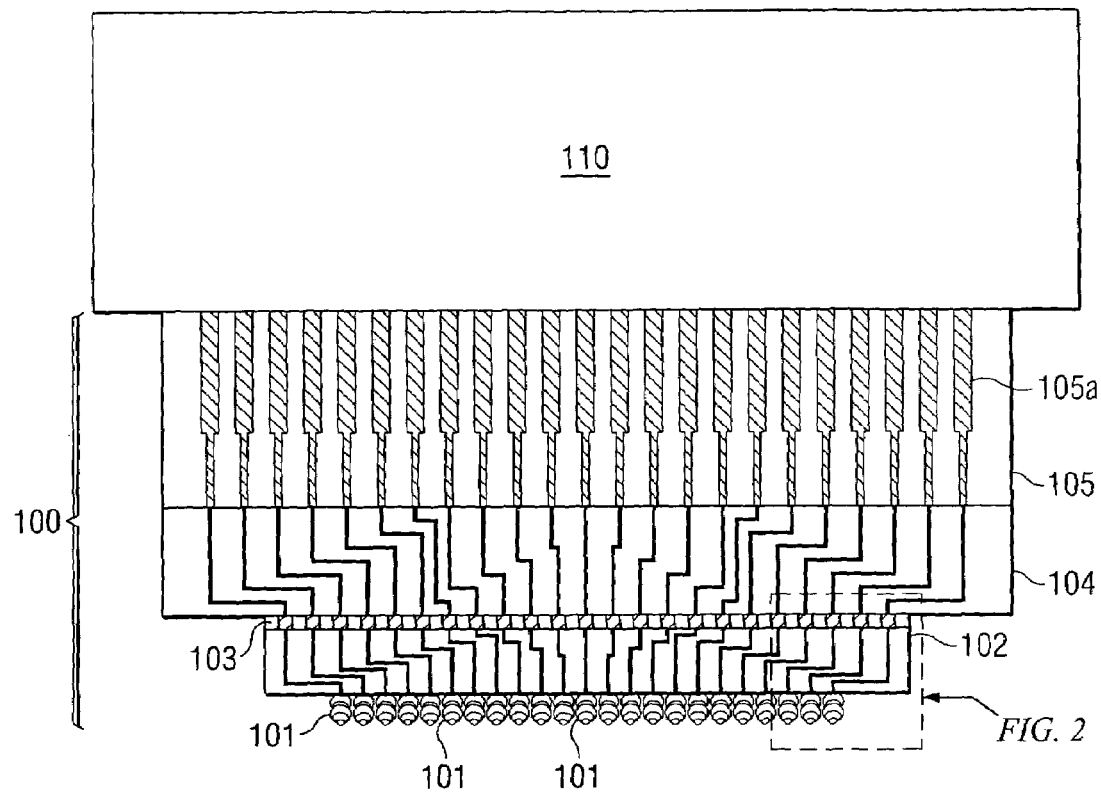
FIG. 1 illustrates schematically a probe card for electrical testing according to the invention, the probe card inserted into a test equipment. The portion marked A is magnified in FIG. 2.

FIG. 1 shows schematically a cross section through an apparatus for testing according to the invention. The apparatus is generally designated 100, and the test equipment 110. Usually, the apparatus is electrically and mechanically connected to the test equipment by a plurality of pins (not shown on FIG. 1) which are pushed into the corresponding sockets of the equipment.

The apparatus 100 consists of several portions: At the surface facing the device-to-be-probed are the actual probes 101, which establish the electrical contacts to the device test pads. The composition, orientation and distribution of probes 101 are discussed in more detail in FIGS. 2 thru 8. Probes 101 are attached the insulating holder 102, which is traversed by metal-filled vias and described in more detail in FIGS. 2 and 7. Holder 102 in turn is attached to a sheet 103 of resilient insulating material, which is traversed by conductive traces and discussed in more detail in FIGS. 2 and 7. Resilient sheet 103 has elastic properties.

Resilient sheet 103 is attached to the printed circuit board 104, which spreads the conductive traces of the probe card to a wider area. The printed circuit board 104, in turn, is contacted by a tower-like portion 105, which contains a plurality of parallel pogo sticks 105a and is, therefore, sometimes referred to as the pogo tower. One end of the pogo sticks protrudes from apparatus 100 as pins in order to serve as connectors to the test equipment 110.

Figure 2:
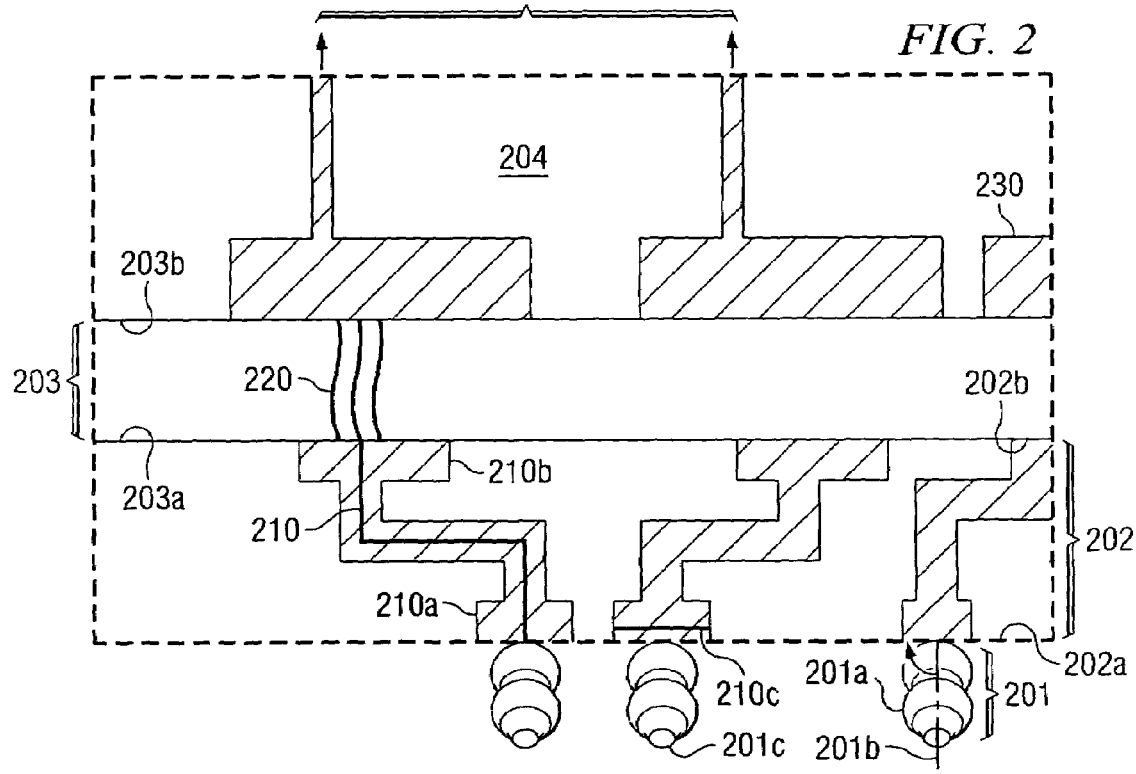
FIG. 2 shows a magnified schematic cross section through the probe card portion marked A in FIG. 1, illustrating certain embodiments of the invention.

FIG. 2 is a schematic and not-to-scale enlargement of portion A of the apparatus cross section in FIG. 1. The test probes 201 comprise a plurality of metal elements 201a. As FIG. 2 indicates, metal elements 102a have about equal size and are bonded together in a substantially linear sequence center-to-center, wherein the linear axis 201b is approximately normal to the first surface 202a of insulating holder 202. When metal elements 201a are fabricated as air balls by typical automated wire bonders, they have substantially rotation-symmetrical shape or even approximately spherical shape.

Figure 3:
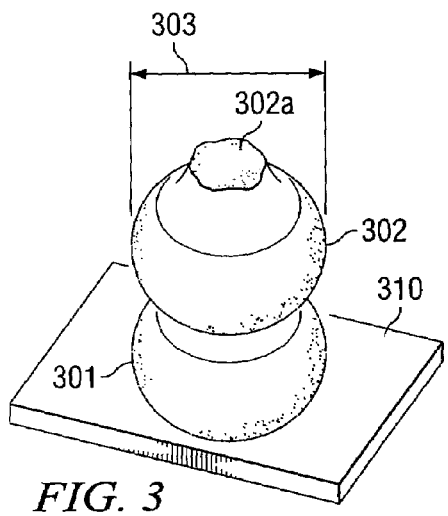
FIG. 3 is a magnified view of an individual probe as employed in the probe card illustrated in FIG. 2.

FIG. 3 shows a first (301) and a second (302) free air ball created by an automated wire bonder and somewhat flattened by pressing them against a substrate 310. The diameter 303 is preferably in the range from about 15 to 40 µm. In the preferred embodiment, the free air balls are made from bonding wires, which comprise an alloy rich in gold, yet hardened by mixtures with a small percentage of copper and other metals. In a customary automated wire bonder, the wire (diameter between preferably between about 15 and 30 µm) is strung through a capillary. At the tip of the wire, a free air ball is created using either a flame or a spark technique. The ball has a typical diameter from about 1.2 to 1.6 wire diameters. The capillary is moved towards the substrate 310 and the ball is pressed against the substrate. The compression (also called Z- or mash) force is typically between about 17 and 75 g. At time of pressing, the temperature usually ranges from 150 to 270° C.

In FIG. 3, the second ball 302 is pressed on top of the first ball 301 in a substantially linear sequence, preferably so that the center-to-center line is approximately normal to the equatorial plane of the balls. Slight deviations from the vertical arrangement can be tolerated. The flame-off tip 302a of the second ball 302 is clearly visible. As FIG. 2 indicates, the flame-off tip (designated 201c) is facing outwardly from the attachment surface 202a of holder 202.

Figure 4:
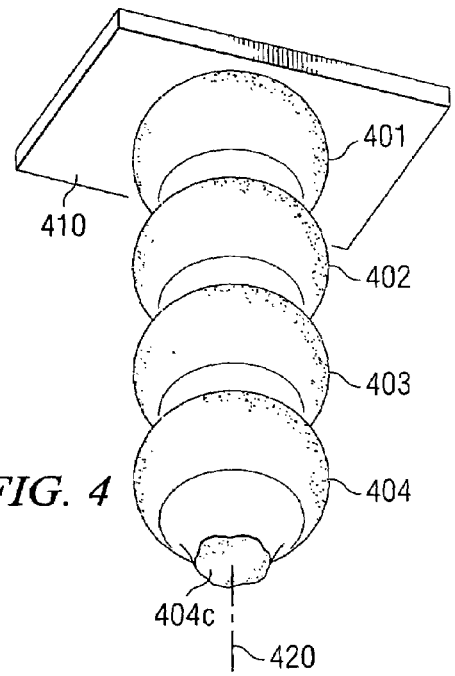
FIG. 4 is a magnified view of another individual probe according to the invention.

FIG. 4 depicts a segmented probe comprising four metal elements 401 to 404, produced and stacked in about linear sequence by automated wire bonding techniques. The flame-off tip 404c points outwardly from attachment surface 410. The axis 420 of the segmented probe is approximately normal to attachment surface 410. It is a technical advantage for some embodiments of the invention that pre-determined probes can be manufactured with more segments than others in order for the probes to exactly follow unequal surface contours of specific devices. Preferably, the segmented probes comprise 2 to 6 metal elements bonded together, thus forming a probe length between about 40 and 120 µm.

Referring now to FIG. 2, the insulating holder is designated 202, its first surface 202a and its second surface 202b. A preferred material for holder 202 is ceramic, since it is well suited to be formed as multilayer component. Holder 202 is traversed from surface 202a to surface 202b by a plurality of metal-filled vias 210. Each via 210 terminates in contact pads on each surface; in FIG. 2, the contact pads on first surface 202a are designated 210a, the contact pads on second surface 202b are designated 210b. The contact pads 202a on first holder surface 202a have a probe 201 attached; preferably, the attachment is so that the probe axis 201b is substantially normal to surface 202a. The pitch center-to-center of contact pads 210a and thus probes 201 is preferably between about 40 and 80 μm.

The preferred metal for vias 210 is copper or a copper alloy, and for the surfaces 202a and 202b of the contact pads a non-oxidizing metal, for instance a (thin) gold or palladium layer, indicated 210c in one example of FIG. 2. There is good metallurgical match and negligible electrical resistance between the gold-clad contact pad surfaces and the gold elements of the probes.

The sheet 203 made of resilient insulating material has first surface 203a and second surface 203b. First sheet surface 203a is adhesively attached to second holder surface 202b. Sheet 203 has a thickness, which is preferably in the range from about 50 to 200 μm. The thickness of the resilient material is selected so that sheet 203 provides a pre-determined amount of elastic compression and expansion. In the case of aluminum as device bond pad metallization, an elastic compression and expansion of at least 10 μm is preferred in order to break reliably through the aluminum oxide.

The thickness is traversed by a plurality of electrically conducting traces, schematically indicated by lines 220, which may be irregular in some embodiments. A preferred example of resilient insulating material with conducting traces is a z-axis conducting elastic polymer including z-axis conducting epoxy or polyimide; in this example, the conducting traces may have a diameter on the order of 1 μm. Another example is an elastomeric material with small wires of a pre-selected density; in this case, the wires may have a diameter on the order of 25μ.

In either case, a plurality of conducting traces 220 are electrically connected to each contact pad 210b and thus provide an electrical path from probe 201 to sheet surface 203b. In turn, sheet surface 203b is (adhesively) attached to printed circuit board 204, bringing conductive traces 220 in electrical contact with the contact pads 230 of printed circuit board 204. The connection between the holder 202 and the printed circuit board 204 may be further strengthened by mechanical locks. As FIG. 1 shows, the contact pads 230 of the printed circuit board connect by means of printed traces to the pogo tower with its pogo connections to the pins into the electronic test equipment. A clearly defined electrical path is thus established between each probe and the test equipment.

Figure 7:
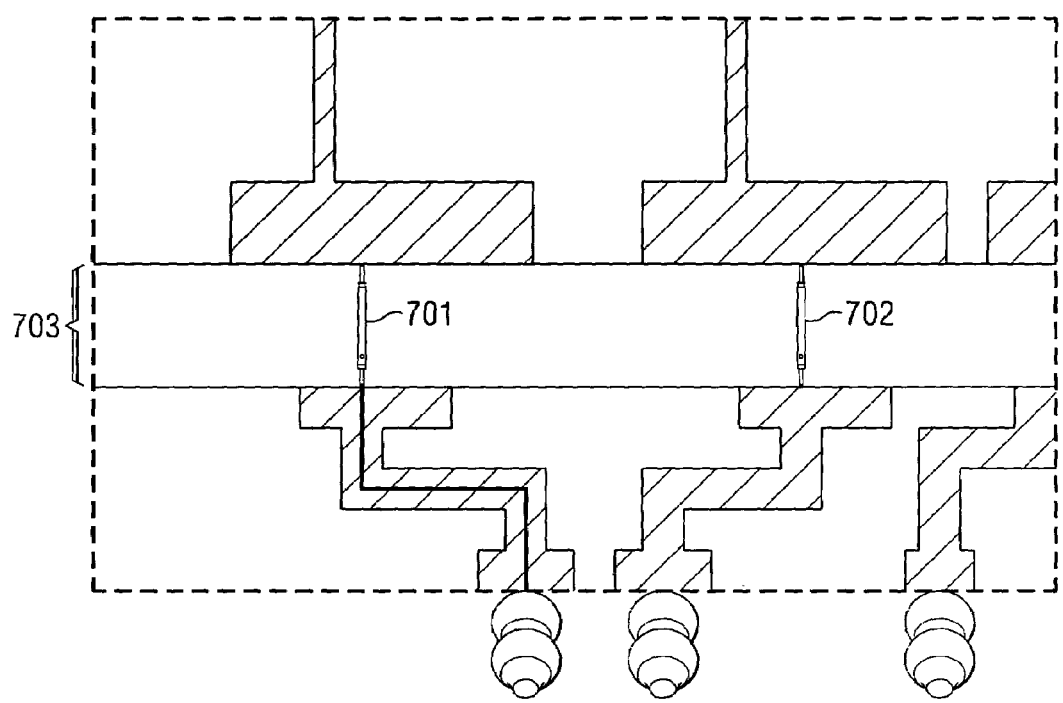
FIG. 7 shows a magnified schematic cross section through the probe card portion marked A in FIG. 1, illustrating other embodiments of the invention.
Figure 8:
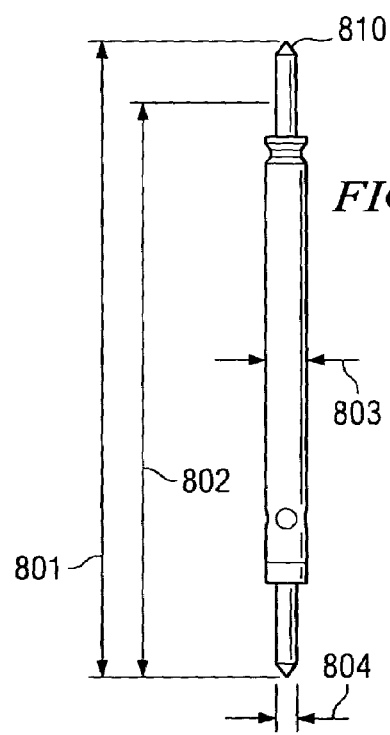
FIG. 8 illustrates a magnified electrically conductive resilient element of the insulating sheet employed by the probe card according to the invention.

Another example of a resilient insulating sheet with conducting traces is a plurality of metallic springs separated by an insulator. FIG. 8 illustrates a metallic pogo spring suitable for providing the resilient characteristic, and FIG. 7 depicts a plurality of pogo springs 701, 702 in an insulating pogo housing 703, which is selected to form the resilient sheet. Pogo spring interposers are commercially available, for instance from the company Rika Denshi, Japan. In the example of FIG. 8, the initial length of the pogo spring is indicated by 801; as an example, it may be about 5.2 mm. When the one plunger 810 is compressed, the operating length 802 may be about 4.8 mm. The diameter 803 of the pogo spring in FIG. 8 is about 0.3 mm; the diameter 804 of the plunger is about 0.1 mm. Pogo springs are commercially offered in a wide variety of length, width, and spring characteristics.

It is evident from all examples described above that the invention provides for the locations of the probes 201 to be selected in customized fashion in both x- and y-directions, opening the opportunity to test pre-selected test pads across the complete chip surface in x- and y-directions. The invention further provides for probes of various lengths and thus for non-coplanar locations of the probe tips 201c, opening the opportunity to test coplanar as well as non-planar chip surfaces.

Figure 5:
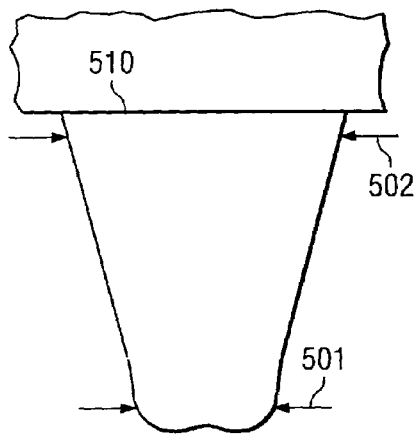
FIG. 5 is a schematic cross section through a probe formed according to the invention.
Figure 6:
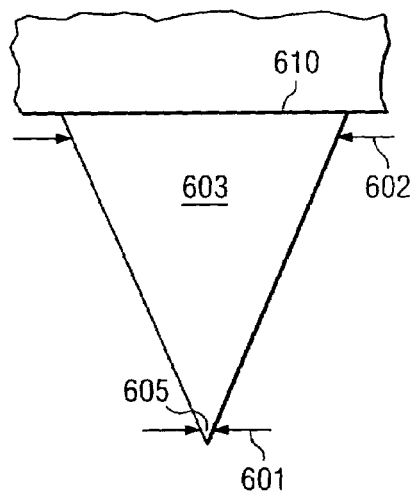
FIG. 6 is a schematic cross section through another probe formed according to the invention.

In another embodiment of the invention, illustrated in FIGS. 5 and 6 schematically and not to-scale, at least the final element on one end of the probe has been coined or stamped to obtain a pointed shape. The coining or stamping process step may also provide a hardening of the probe tip. In the cross section of FIG. 5, the diameter 501 of the probe tip has obtained a considerably smaller diameter than the original probe diameter 502. In the cross section of FIG. 6, the whole probe has been stamped into a shape so that it gradually narrows from its end 603 attached to the contact pad 610 to its remote end 605; the remote end has an approximately point-like configuration. In the examples of FIGS. 5 and 6, the probe is attached to the first holder surface 510 and 610, respectively, so that the pointed element 501 and 601, respectively, point outward from the holder surface.

Another embodiment of the invention is an electrically tested semiconductor device having a plurality of test members. Examples for test members are flat metal test pads in one plane; metal test pads in various planes; metal reflow elements (such as solder balls) in one plane; and metal reflow elements in various planes.

In the embodiment, an apparatus is provided, which has a structure as described above in detail. In essence, the apparatus comprises a probe with a plurality of metal elements of about equal size bonded together in substantially linear sequence. The apparatus further has an insulating holder with first and second surfaces and a plurality of metal-filled vias traversing the holder from the first to the second surface. The vias form contact pads on the first and second surfaces; the location of the contact pads on the first surface match the locations of the test pads of said semiconductor device. The contact pads of the first holder surface have a probe attached so that the probe is positioned about normal to the surface.

The apparatus further has a sheet of resilient insulating material with first and second surfaces and a thickness, traversed by a plurality of conducting traces. The first sheet surface is attached to the second holder surface so that at least one of the traces contacts one of the contact pads, respectively, to provide an electrical path to the second sheet surface. Finally, the apparatus has a printed circuit board suitable for insertion into an electrical test apparatus; the board is attached to the second sheet surface so that a continuous electrical path is established from the apparatus to each of the probes.

Next in the embodiment, the apparatus is aligned with the semiconductor device so that the probes are aligned with the test members, respectively. The probes of the apparatus are then brought in contact with the test members so that the sheet of resilient material is compressed, whereby the probes break through any metal oxide layer on the test members and the electrical testing can get started.

The elastic characteristics of the resilient sheet provide enough force to the probes, which are about vertically attached to the apparatus and about vertically impinging on the device test members, so that the break though any metal oxide on the test members can be accomplished without the help of cantilevers. In this manner, the testing procedure leaves only minimal marks without smearing in the metallization of the test pads, which greatly simplifies subsequent processing steps of the semiconductor device.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the embodiments are effective in semiconductor devices and any other device with test pads, for which electrical measurements need to be taken, for instance substrates and printed circuit boards, assembled multi-device products, and piece part units. As another example, the semiconductor devices may include products based on silicon, silicon germanium, gallium arsenide and other semiconductor materials employed in manufacturing. As yet another example, the concept of the invention is effective for many semiconductor device technology nodes and not restricted to a particular one. It is therefore intended that the appended claims encompass any such modifications or embodiments.

I claim:

1. An apparatus for electrical testing, comprising:
   a segmented probe comprising a plurality of metal elements of about equal size bonded together in substantially linear sequence;
   an insulating holder having first and second surfaces and a plurality of metal-filled vias traversing said holder from said first to said second surface, said vias forming contact pads on said first and second surfaces;
   said contact pads of said first holder surface having a probe attached so that said probe is positioned about normal to said surface;
   a sheet of resilient insulating material having first and second surfaces and a thickness, traversed by a plurality of conducting traces, said first sheet surface attached to said second holder surface so that at least one of said traces contacts one of said contact pads, respectively, to provide an electrical path to said second sheet surface; and
   a printed circuit board suitable for insertion into an electrical test apparatus, said board attached to said second sheet surface so that a continuous electrical path is established from said apparatus to each of said probes.

2. The apparatus according to claim 1 wherein said metal elements have a substantially rotation-symmetrical shape.

3. The apparatus according to claim 2 wherein said metal elements have approximately spherical shape.

4. The apparatus according to claim 2 wherein said elements have a diameter between about 15 and 40 µm.

5. The apparatus according to claim 1 wherein said segmented probe comprises about 2 to 6 elements bonded together in substantially linear sequence.

6. The apparatus according to claim 5 wherein some probes have more segments than others.

7. The apparatus according to claim 5 wherein said segmented probe has a length between about 40 and 120 µm.

8. The apparatus according to claim 1 wherein the final element on one end of said probe has a pointed shape and said probe is attached to said first holder surface so that said pointed elements point outwardly from said holder surface.

9. The apparatus according to claim 8 wherein said probe is shaped so that it gradually narrows from its end attached to said contact pad to its remote end, said remote end having a point-like configuration.

10. The apparatus according to claim 8 wherein said pointed probe elements are not co-planar.

11. The apparatus according to claim 1 wherein said metal elements of said probe comprise a non-oxidizing metal including gold.

12. The apparatus according to claim 1 wherein said contact pads on said holder surfaces are distributed in x- and y-direction.

13. The apparatus according to claim 1 wherein the pitch center-to-center of said probes is between about 40 and 80 µm.

14. The apparatus according to claim 1 wherein said sheet of resilient insulating material is a z-axis conducting elastic polymer including z-axis conducting epoxy or polyimide.

15. The apparatus according to claim 1 wherein said sheet of resilient insulating material comprises a plurality of springs, separated by an insulator.

16. The apparatus according to claim 1 wherein said thickness of said resilient insulating material provides an elastic compression and expansion of at least 10 µm.

17. The apparatus according to claim 1 wherein said contact pads on said first and second holder surface have a surface formed by a non-oxidizing metal.

18. A method for electrical testing of a semiconductor device having a plurality of test members, comprising the steps of:
   providing an apparatus comprising:
      a segmented probe having a plurality of metal elements of about equal size bonded together in substantially linear sequence;
      an insulating holder having first and second surfaces and a plurality of metal-filled vias traversing said holder from said first to said second surface, said vias forming contact pads on said first and second surfaces, the location of the contact pads on said first surface matching the locations of said test pads of said semiconductor device;
      said contact pads of said first holder surface having a probe attached so that said probe is positioned about normal to said surface;
      a sheet of resilient insulating material having first and second surfaces and a thickness, traversed by a plurality of conducting traces, said first sheet surface attached to said second holder surface so that at least one of said traces contacts one of said contact pads, respectively, to provide an electrical path to said second sheet surface; and
      a printed circuit board suitable for insertion into an electrical test apparatus, said board attached to said second sheet surface so that a continuous electrical path is established from said apparatus to each of said probes;

aligning said apparatus with said semiconductor device so that said probes are aligned with said test members, respectively;

bringing said probes of said apparatus in contact with said test members so that said sheet of resilient material is compressed, whereby said probes break through any metal oxide layer on said test members; and providing sufficient time so that said resilient material returns elastically to its uncompressed state and said electrical testing can get started.

19. The method according to claim 18 wherein said test members are metal contact pads or metal reflow elements.

* * * * *